United States Patent [19]
Lowther et al.

[11] Patent Number: 5,637,908
[45] Date of Patent: Jun. 10, 1997

[54] STRUCTURE AND TECHNIQUE FOR TAILORING EFFECTIVE RESISTIVITY OF A SIPOS LAYER BY PATTERNING AND CONTROL OF DOPANT INTRODUCTION

[75] Inventors: Rex E. Lowther, Palm Bay; James D. Beason, Melbourne, both of Fla.

[73] Assignee: Harris Corporation, Melbourne, Fla.

[21] Appl. No.: 314,489

[22] Filed: Sep. 28, 1994

[51] Int. Cl.⁶ .................. H01L 29/34; H01L 27/098; H01L 27/02; H01L 29/40
[52] U.S. Cl. .................. 257/489; 257/630; 257/343; 257/636; 257/496; 257/380; 257/168
[58] Field of Search .................. 257/109, 110–112, 257/169, 168, 489, 496, 629, 636, 343, 341, 493, 467, 380, 630

[56] References Cited

U.S. PATENT DOCUMENTS

| | | | |
|---|---|---|---|
| 4,080,619 | 3/1978 | Suzuki | 257/905 |
| 4,691,223 | 9/1987 | Murakami et al. | 257/489 |
| 4,803,533 | 2/1989 | Chang | 257/345 |
| 5,031,021 | 7/1991 | Baba et al. | 257/490 |
| 5,086,332 | 2/1992 | Nakagawa et al. | 257/380 |
| 5,258,641 | 11/1993 | Kida et al. | 257/343 |
| 5,315,139 | 5/1994 | Endo | 257/630 |
| 5,479,030 | 12/1995 | Mari | 257/141 |

FOREIGN PATENT DOCUMENTS

| | | | |
|---|---|---|---|
| 0064365 | 3/1989 | Japan | 257/343 |
| 0212464 | 8/1992 | Japan | 257/343 |

*Primary Examiner*—Sara W. Crane
*Assistant Examiner*—Alexander Oscar Williams
*Attorney, Agent, or Firm*—Charles E. Wands

[57] ABSTRACT

An increase in breakdown voltage of a semiconductor device upon which a layer of high resistance material, such as SIPOS, has been formed is achieved by controllably modifying the physical composition of the high resistance layer, for example by patterning a plurality of generally wedge-shaped apertures into the layer, so that the electric field in the underlying substrate is made more uniform across the surface of the device. This increase in uniformity in the radial direction effectively spreads out or reduces the field away from its normal peak region near the corner of the drain/substrate PN junction. In most versions of this device, an additional advantage—decreased leakage current—is realized.

64 Claims, 6 Drawing Sheets

STRUCTURE AND TECHNIQUE FOR TAILORING EFFECTIVE RESISTIVITY OF A SIPOS LAYER BY PATTERNING AND CONTROL OF DOPANT INTRODUCTION

FIELD OF THE INVENTION

The present invention relates in general to the manufacture of semiconductor circuit architectures and is particularly directed to a technique for controlling the effective resistivity of a layer of semi-insulating polycrystalline silicon (SIPOS), so as to increase the breakdown voltage of a PN junction formed in semiconductor material upon which the SIPOS layer is disposed.

BACKGROUND OF THE INVENTION

Semi-insulating polycrystalline silicon (SIPOS) is currently employed as a surface passivation material in high voltage semiconductor devices. For a discussion of the general properties of SIPOS, attention may be directed to an article by T. S. Chao, entitled "Characterization of Semi-Insulating Polycrystalline Silicon Prepared by Low Pressure Chemical Vapor Deposition," J. Electrochem. Soc., Vol. 140, No. 9, September 1993, pp 2645–2548. Because of its very high, but finite resistivity, when a SIPOS layer is formed on the top surface of a high voltage device, it has the effect of making the electric field more linear by forcing the potential of a PN junction directly beneath the SIPOS to be graded more linearly in the lateral direction (parallel to the top surface of the device); the electric field would otherwise tend to have a generally parabolic characteristic.

This ability of a SIPOS layer to reduce the lateral electric field can be used to advantage in any geometry device, including both straight and curved-geometry configurations. What is significant is the fact that a SIPOS layer affords a reduction of the lateral field in the vicinity of an underlying PN junction where the magnitude of the field is highest.

It may also be observed that, regardless of its overall geometry (e.g. straight or curved), any device will have curved edges where there is a concentration of the field. Even if it were possible to eliminate the curvature of an edge, it is still an edge, where breakdown will occur. It may be said, however, that a linear configuration has better breakdown properties than a curved configuration, since breakdown is initiated where there is a concentration of the field (in the vicinity of a departure from a linear region).

Thus, in a commonly employed symmetrically circular or cylindrical geometry device, having a center circular or disc-shaped electrode contacting a first region of the device and a second annular electrode spaced apart from and surrounding the center electrode (as in the case of respective center drain and annular source contacts of a circular DMOS FET structure), the surface area available for current flow increases with increase in radial distance from the center electrode. As a result, the radial resistance of the SIPOS layer decreases as the (radial) distance from the drain electrode increases, so that the electric field in the device beneath the SIPOS decreases as one departs from the drain electrode, or, conversely, is greater in the vicinity of the center drain electrode where curvature of the underlying PN junction is more pronounced. Thus, the device breaks down at the drain/substrate PN junction (where the electric field is highest).

SUMMARY OF THE INVENTION

In accordance with the present invention, the above discussed voltage breakdown problem of a PN junction resulting from the non-linearity of the electric field beneath a high resistivity material, such as an undoped polysilicon layer or a SIPOS layer, is effectively remedied by controllably modifying the physical composition of the high resistivity material in such a manner that the electric field in the underlying substrate is made more uniform across the surface of the device. For the non-limiting case of a cylindrically symmetrical (DMOS) device, making the field more uniform in the radial direction effectively spreads out or reduces the field away from its normal peak region near the corner of the underlying (drain/substrate) PN junction, thereby increasing the voltage breakdown of that PN junction.

Pursuant to a first embodiment of the present invention, the physical configuration of the high resistivity material (SIPOS) layer is altered by selectively patterning a plurality of apertures into the SIPOS. For the example of a circular device, the apertures are located radially distant from the PN junction between the substrate (DMOS channel) and the centrally located drain region (where the field concentration is highest). The apertures reduce the surface area of the SIPOS through which current can flow, and thereby increase the effective resistivity of that portion of the SIPOS layer spaced apart from the drain region. The net effect is to change the "average conductivity" of the SIPOS layer and thereby optimize the electric potential in the underlying substrate, such that the maximum value of the electric field is minimized. (By "average conductivity" is meant that if apertures are used, the conductivity of the SIPOS layer is "averaged" over several apertures and spacings between apertures. Thus, the apertures, which themselves have no conductivity, serve to decrease this average conductivity. The same analysis applies to "average resistivity" and to "effective resistivity.")

In the above described architecture, increasing the effective resistivity by virtue of the presence of the apertures forces current flowing through those portions of the SIPOS layer having increased circumferential area (due to their greater radial distance from the drain region) to be 'squeezed' into a plurality of channels between the apertures in the course of its flow path, thereby modifying the electric field characteristic in the underlying substrate.

In the vicinity of the centrally located drain region, the value of the lateral (here-radial) component of the electric field should be as small as possible. In this area, therefore, the physical composition of the SIPOS layer is unaltered. The lateral/radial component of the electric field begins to increase substantially at those portions of the SIPOS where the current flow changing apertures are introduced, so as to cause an effective increase in the effective resistivity of the SIPOS layer at those locations.

Pursuant to a preferred embodiment of the invention, for a circularly configured device, the resistivity-modifying apertures are wedge shaped, with the radial locations where the apertures are initially placed in the SIPOS layer being the points of the wedges, so that the apertures diverge outwardly from the points along first sidewall portions, and then continue along additional edges (parallel to the adjacent edge from the adjacent aperture). By bringing the apertures to a point and, further, sharply reducing the degree of divergence of the sidewalls from the point, current deflection by the apertures of the SIPOS layer is reduced. This, in turn, reduces fringing effects that may cause breakdown if they become a significant contribution to the electric field. Analysis has shown that an aperture divergence angle in a range on the order of 45°–65° is sharp enough to keep fringing fields from becoming too large.

At those surface portions of the substrate radially outwardly spaced from the center of the device, in the vicinity of the source region, the distance between the sidewalls of each aperture is adjusted such that the width of each channel of the layer of SIPOS through which current flows is constant from the region to the annular source region. The effect is to make the overall tangential width of the SIPOS a constant with respect to radius in this region.

Because the aperture configuration of the patterned SIPOS layer loses some of its ability to control the potential in and below the apertures, allowing the electric field beneath the SIPOS layer to draw inwardly toward the drain (which has the undesirable effect of causing sharp gradients in the potential in the lateral direction perpendicular to the radial channels along the apertures sidewalls), the SIPOS current flow regions may also preferably include circumferential channel components, that connect the radially directed channels.

The effect of each circumferential or transverse channel is to reduce the radial dimension of each aperture, reducing the amount that the field lines are allowed to stray. The additional channels provide a boundary condition that the electric potential is nearly exactly constant along these channels, even at locations where the transverse channels intersect the radial channels, which decreases the fringing contribution to the electric field to an acceptable level. In order to prevent too large an electric field from occurring in the apertures, the transverse channels are dimensioned so that the total radial widths of these channels is small compared with the radial dimensions of the apertures.

In accordance with a second embodiment of the invention, rather than pattern the SIPOS layer with a plurality of apertures, modification of the physical composition of the SIPOS layer may be accomplished by selectively doping the SIPOS with a resistivity-altering impurity. The masking pattern used to dope the impurity may contain a plurality of dopant introduction-apertures shaped similar to the apertures formed in the SIPOS in the first embodiment. The effect of the selective impurity introduction is to increase the conductance of the SIPOS in the vicinity of the drain region and thereby reduce the voltage drop across that portion of the SIPOS layer containing the dopant.

In accordance with a further embodiment of the present invention, the desired increase in effective resistivity of the SIPOS layer is achieved by forming one or more channels in a spiral path through the SIPOS layer, the spiral channel extending between the centrally located drain region and the annular source region, which surrounds the drain region. In effect, the spiral channel confines the effective current flow path through the SIPOS layer to a spiral track that occupies the SIPOS layer from and around the center drain region out to the surrounding source region.

DETAILED DESCRIPTION

As pointed out briefly above, the present invention serves to minimize the maximum electric field in semiconductor material beneath a high resistivity material, such as an undoped polysilicon or SIPOS layer, by controllably modifying the physical composition of the high resistivity layer in such a manner that the electric field is effectively spread out in a (radial, in the case of a circular geometry device) direction away from its normal peak region near the corner of the drain/substrate PN junction, thereby increasing the voltage breakdown of the drain/substrate PN junction. This is accomplished by selectively increasing the average resistivity of that portion of the high resistivity layer where a larger voltage drop is allowed.

Figure 1:
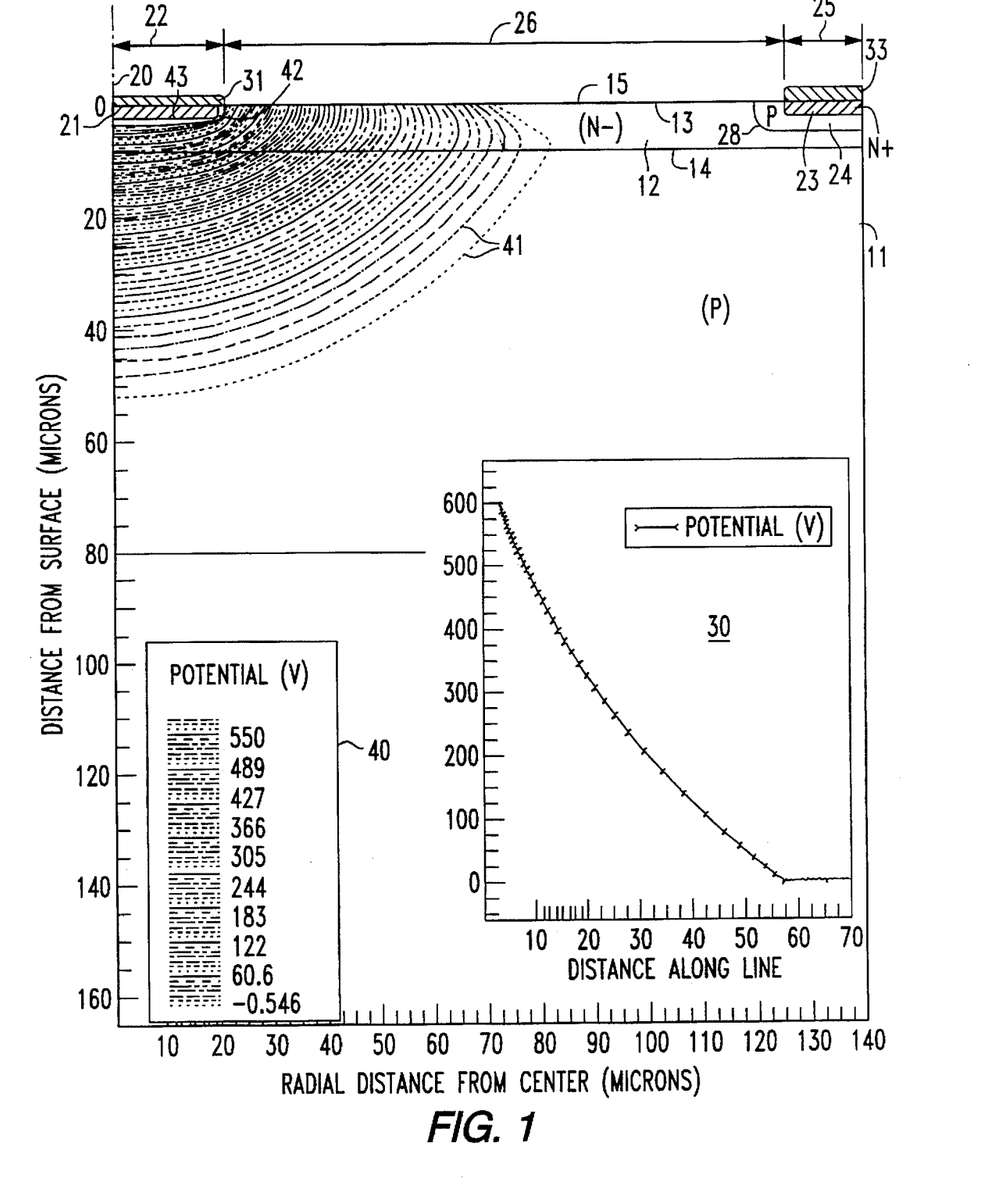
FIG. 1 diagrammatically illustrates a cross-sectional slice of a semiconductor device having cylindrical symmetry upon which a layer of SIPOS is formed.

To facilitate an understanding of the mechanism employed by the present invention, it is useful to consider a cross-sectional slice of a semiconductor device, such as an N-channel DMOS device, having a generally cylindrical or circular symmetry, which is diagrammatically illustrated in FIG. 1 as comprising a semiconductor substrate 11, such as a layer of P-type silicon, having a top layer 12 of N-type (epitaxially formed), which forms a PN junction 14 with the P material of underlying substrate 11. N-type layer 12 has a top surface 13 upon which a layer 15 of high resistivity material is formed.

Figure 2:
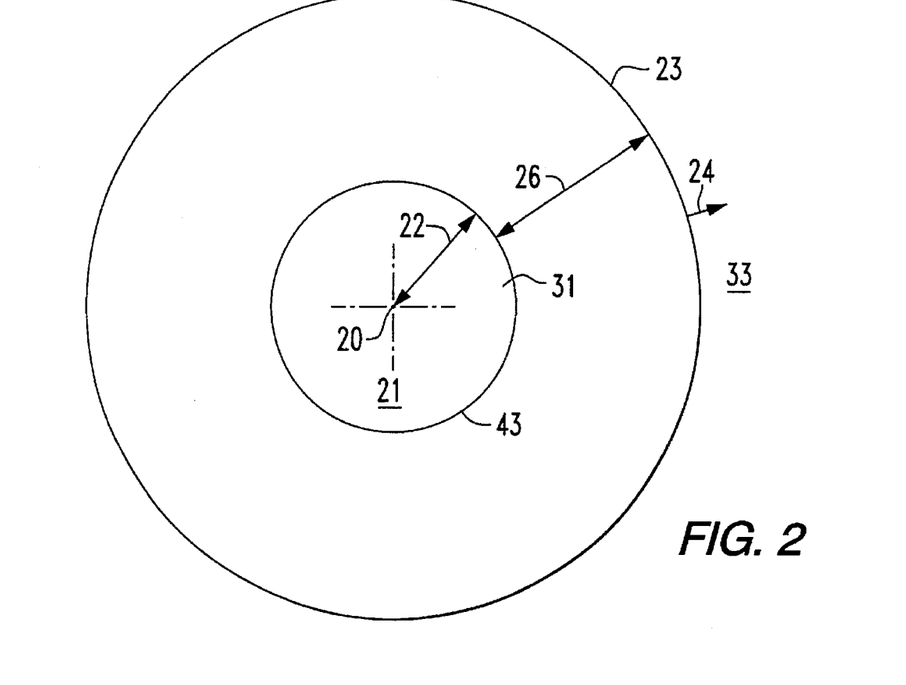
FIG. 2 is a top view of the device of FIGS. 1 and 1A.

In the embodiment of FIG. 1, high resistivity layer 15 may comprise a SIPOS layer and the geometry of the architecture may have a cylindrical or circular symmetry about an axis 20. It will be readily understood by those skilled in the art that the device geometry described here is not limited to that of the example or to a specific conductivity type device. Where the invention is embodied in a DMOS structure, for example, the device may alternatively be a P-channel device; moreover, the invention may be readily applied to other types of devices having high voltage (planar) junctions, non-limiting examples of which as will be described. FIG. 2 shows a top view of the device of N-channel DMOS device of FIG. 1.

Figure 1A:
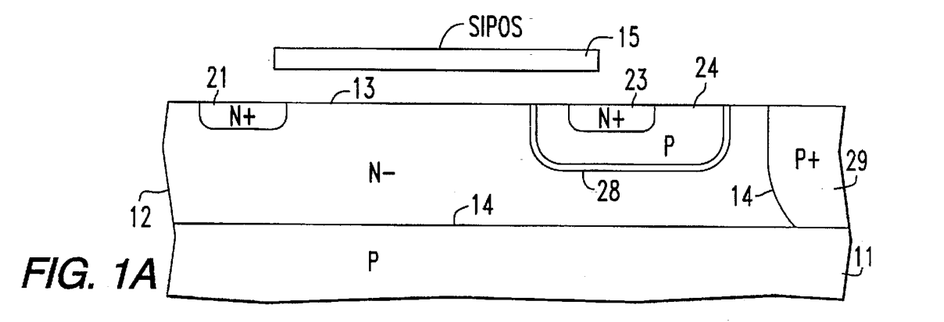
FIG. 1A further diagrammatically illustrates the N-channel DMOS device of the example of FIG. 1.

The generally cylindrically symmetrical N-channel DMOS device (or lateral bipolar NPN device) of the example of FIGS. 1 and 2 is further diagrammatically illustrated in FIG. 1A (with SIPOS layer 15 being understood to overlie a surface oxide layer not shown) as being formed in a junction isolated island, and including a shallow, centrally located, generally circular or disc-shaped N+ drain contact region 21 formed in a first surface portion 22 of N-layer 12. A drain electrode 31 is formed on drain contact region 21. The junction isolation is provided by a surrounding P+ region 29 and underlying P-type substrate 11, with the PN junction 14 extending further vertically along the interface between surrounding P+ region and N-type epitaxial layer 12.

A generally annularly configured N+ source region 23 is formed in a like configured (generally annularly shaped) P-type channel region 24 disposed in a second surface portion 25 of N-type layer 12, separated from surface portion 22 by an intervening third surface portion 26 of N-type layer 12, therebetween. A source electrode 33 is formed on N+ source region 23. A high voltage junction 28 is formed between P-channel region 24 and N-type layer 12. The SIPOS layer 15 extends over the third surface portion 26 of N-type layer 13 between the central, circular drain contact region 21 and the surrounding source region 23. SIPOS layer 15 is coupled in ohmic contact with each of the N+ drain contact region 21 and the N+ source region 23. To avoid cluttering the Figures, the insulated gate structure for an N-channel DMOS device overlying the P-type channel region 24 between the source and drain regions is not shown.

Figure 1B:
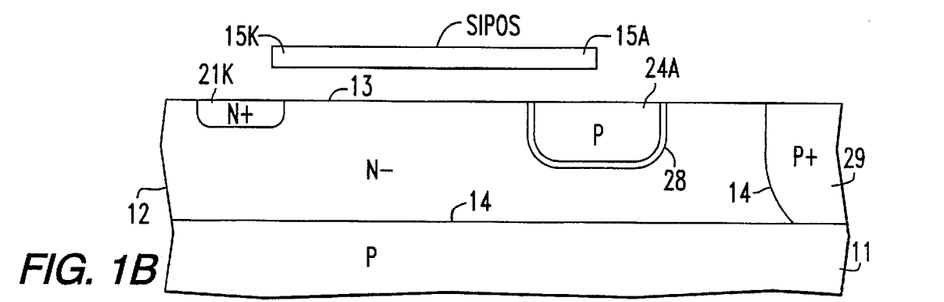
FIGS. 1B–1D diagrammatically illustrate alternative structures with which the surface SIPOS layer employed in the DMOS architecture of FIGS. 1 and 1A may be used with like effect.
Figure 1C:
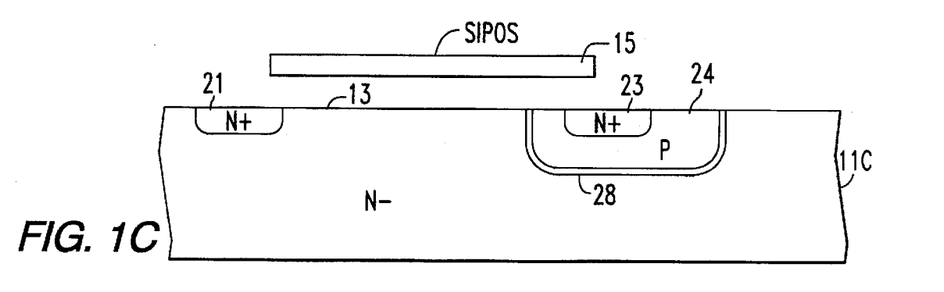
Figure 1D:
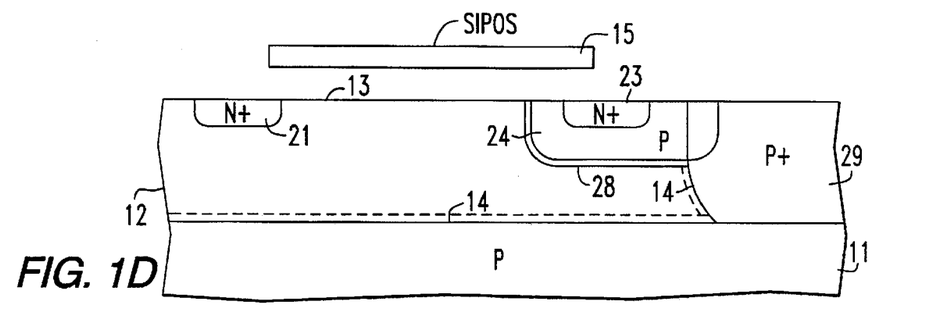

FIGS. 1B–1D diagrammatically illustrate alternative structures with which the surface SIPOS layer 15 employed in the DMOS architecture of FIGS. 1, 1A and 2 may be used with like effect. In particular, FIG. 1B shows a diode structure in which SIPOS layer 15 overlies a (NON-illustrated) layer of oxide disposed on the top surface 13 of epitaxial layer 12, between N+ cathode contact region 21K and P-type anode region 24A. Opposite ends 15K and 15A of SIPOS layer 15 are ohmically connected with cathode contact region 21K and P-type anode region 24A, respectively.

FIG. 1C shows a non-RESURF version of the NPN or DMOS architecture of FIG. 1A, wherein SIPOS layer 15 overlies a non-illustrated surface oxide layer between N+ drain contact region 21 formed in a first surface portion of an N-type substrate 11C and an N+ source region 23, which is formed in P-type channel region 24. The SIPOS layer 15 extends between the central, circular N+ drain contact region 21 and the surrounding source region 23. As in FIG. 1A, SIPOS layer 15 is coupled in ohmic contact with each of the N+ source contact region 21 and the N+ drain region 23.

FIG. 1D shows a modification of the structure of FIG. 1A, wherein the P-type channel region 24 overlaps P+ region 29, so that the high voltage drain/channel junction 28 merges with isolation junction 14 and is thereby tied to the underlying substrate.

Superimposed on the cross-sectional slice of FIG. 1 are equipotential contour lines 41 which are associated with the application of a prescribed reverse bias (e.g. 600 volts) between the N+ drain contact region 21 and the underlying P-type substrate 11 (whose associated ohmic contact, not shown, is grounded). The source contact (not shown) is also grounded. An inlaid plot of the potential across the SIPOS layer 15 is shown at 30, while the associated voltage contour values are shown at superimposed voltage plot 40. The density of contour lines 41 reveals that the maximum electric field (e.g. on the order of $0.48 \times 10^6$ V/cm) occurs near the corner 42 of N+ drain contact region 21. (Without the SIPOS layer 15, this value would be much larger.)

The magnitude of the electric field $|E|$ produced within the underlying semiconductor material may be defined as:

$$|E|=(E_r^2+E_v^2)^{1/2},$$

where $E_r$ is the radial component of the electric field, and $E_v$ is the vertical component of the electric field.

In order to maximize the voltage at which the PN junction 14 between N-type epitaxial 43 layer and underlying P-type substrate 11 breaks down, the maximum value of the electric field $|E|$ should be minimized.

It should be observed that the potential in the SIPOS layer 15, which is substantially independent of the conditions of the underlying semiconductor material, is determined in accordance with the ohmic conductance of the current flow through the SIPOS layer 15. By proximity, the electric potential in the underlying silicon at the silicon/SIPOS interface (top surface 13) must be equal to (or at least very close to) the potential in the SIPOS layer. The requirement means that $E_r$ within that portion of the substrate 11 very close to its top surface 13 is nearly equal to the potential within the SIPOS layer.

As noted earlier, the present invention controllably modifies the physical composition of the SIPOS layer so as to effectively change the average conductivity of the SIPOS layer and thereby optimize the electric potential in the underlying substrate such that the maximum value of the electric field $|E|$ is minimized. For this purpose, the electric field may be initially analyzed in terms of only its lateral/radial component $E_r$. For the linear case without SIPOS patterning, the lateral/radial electric field component $E_r$ is constant across the SIPOS layer between the drain and the source, so that the voltage drop would be linear (decreasing linearly with distance from the drain to the source).

This device also has a component $E_v$ near the N+ drain contact region. As a result, the breakdown voltage can be improved by reducing $E_r$ in the vicinity of the N+ drain contact region 21 (preferably less than its value in the vicinity of the N+ source region 23). For large lateral radial (r) values (laterally far away from the corner 42 of N+ drain contact region, compared with its depth in the vertical direction), the ideal SIPOS electric field approaches a constant function, as described above. In curved regions, $E_r$ tends to be higher close to the drain/substrate PN junction 14 than in straight regions. In these curved regions, the present invention will have the most benefit. (It may be noted that it is not qualitatively different from straight regions, only quantitatively.)

Figure 3:
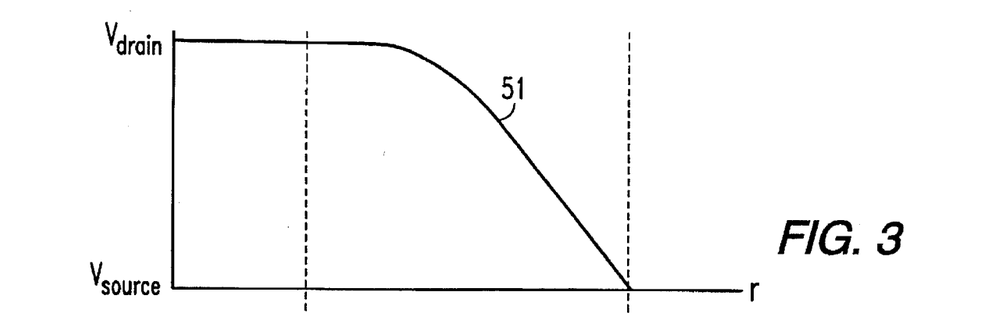
FIGS. 3 and 4 respectively diagrammatically illustrate ideal functions for the SIPOS electric potential with radial distance and its derivative with respect to radius (the radial electric field), respectively.
Figure 4:
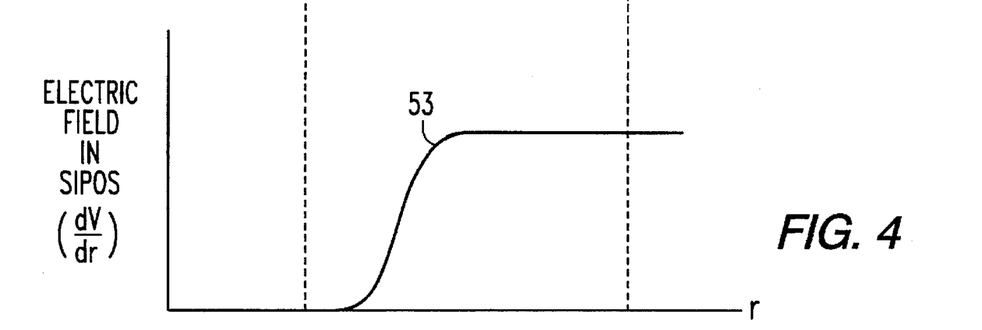

The ideal functions for the variation in electric potential with (radial) distance from the axis 20 in the SIPOS layer 15 and its derivative with respect to the radius (the radial electric field) are diagrammatically shown as function 51 in FIG. 3 and function 53 in FIG. 4, respectively. As pointed out earlier, the present invention functions to modify the composition of the SIPOS layer so as to adjust its effective (average) resistivity that will produce a field distribution that approaches that of FIGS. 3 and 4.

Figure 5:
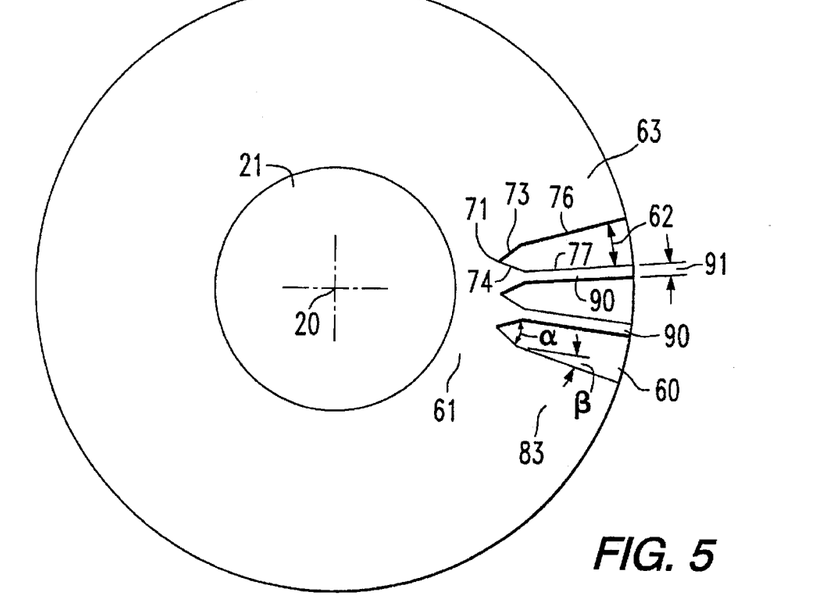
FIG. 5 diagrammatically illustrates a top view of a first embodiment of the present invention in which a plurality of apertures are formed on the outer portion of a SIPOS layer to increase the average resistivity of the SIPOS layer.

Pursuant to a first configuration of tailoring the composition of the SIPOS layer, diagrammatically illustrated in FIG. 5, the effective resistivity of the SIPOS layer is different (e.g. higher) farther away from the N+ drain region 21, or closer to the source region 23, by physically interrupting the normal current flow path through this portion of the SIPOS layer. Such interruptions or discontinuities in the current flow path may be implemented by forming apertures through the SIPOS layer, in the vicinity of the source region in the present example, thereby increasing the effective resistivity at the locations of the apertures, forcing the current to be 'squeezed' into a plurality of channels (optimally of constant cross section) between the apertures in the course of its flow path between the drain and the source regions, and thereby providing the desired electric field characteristic.

Figure 7:
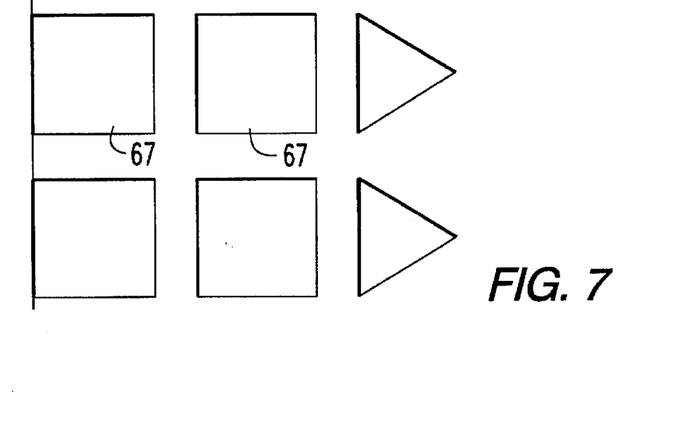
FIG. 7 is an enlarged diagrammatic illustration of a plurality of apertures formed in a SIPOS layer.
Figure 8:
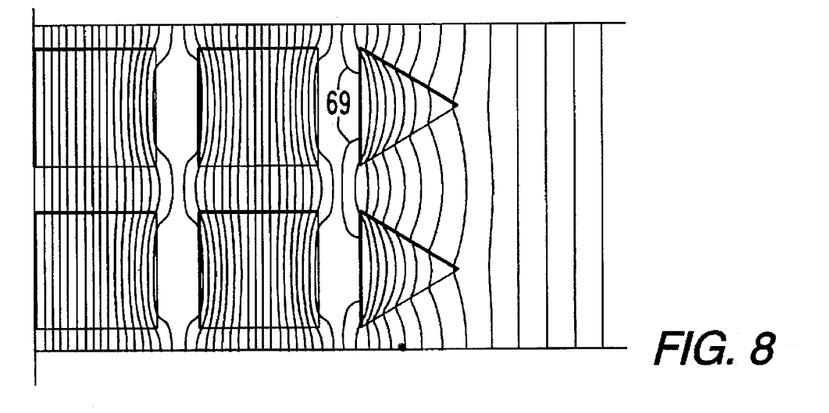
FIG. 8 shows equipotential lines associated with the apertures of FIG. 7.

More particularly, as diagrammatically illustrated in FIG. 5, for small radial values, in the vicinity 61 of the N+ drain contact region 21, where the value of $E_r$ should be as small as possible, the SIPOS layer 15 is unaltered. As the radial distance increases, however, the $E_r$ component of the electric field begins to decrease substantially with r, as the effective tangential width W or $2\pi r$, which corresponds to the circumference of the remaining portion 63 of SIPOS at that radius, increases. It is at this point that current flow changing apertures 60 are introduced into the SIPOS layer 15, so as to reduce W, thereby causing an increase in the effective resistivity of the SIPOS layer at that radius. Such discontinuities may take the form of regularly shaped apertures, such as rectangular apertures 67 diagrammatically illustrated in FIG. 7, and having associated equipotential lines 69 shown in FIG. 8.

Pursuant to the configuration of the SIPOS layer shown in FIG. 5, however, the resistivity-modifying apertures 60 are wedge-shaped, with the radial locations where the apertures are initially placed in the SIPOS layer being the points 71 of the wedges, so that the apertures diverge at a first angle $\alpha$ from points 71 along sidewalls 73, 74 and then continue at a smaller divergence angle $\beta$ in the (nearly) radial direction along additional sidewalls 76, 77.

By bringing the apertures to a point 71 and, further, sharply reducing the angle degree $\beta$ of divergence of sidewalls 76, 77 from the sidewalls 73, 74 that diverge at angle $\alpha$ from the point 71, there is a more gradual deflection of the current by the apertures 60 of the SIPOS layer 15 as the current flows into channels 90 between the apertures, so that the sides of channels 90 are generally parallel to one another along sidewalls 76, 77. This reduces fringing effects which may cause breakdown, if they become a significant contribution to |E|.

If the divergence angle from point 71 along sidewalls 73, 74 is too sharp, however, then the widths 62 of the apertures 60, which gradually increase in the radial direction outward from the center 20, do not become sufficiently large to provide the necessary increase in effective resistivity. As stated earlier, analysis has shown that an aperture divergence angle in a range on the order of 45°–65° is sharp enough to prevent the fringing fields from becoming too large.

As pointed out above, at radially outer surface portions 83 of the substrate (in the vicinity of the source region 23), the distance between the sidewalls 76, 77 of each aperture is tapered gradually, so that the width 91 of each channel 90 of the layer of SIPOS through which current flows is generally constant to the annular source region 23. This makes the overall effective tangential width W of the SIPOS a constant (equal to the width 91 of an individual channel 90 times the number of channels), providing the constant electric field desired in the outer portion of the SIPOS.

The aperture configuration of the patterned SIPOS layer of FIG. 5 loses some of its ability to control the potential in and below the holes, allowing the tendency of the electric field in the substrate beneath the SIPOS layer to draw inwardly toward the drain, and having the undesirable effect of causing sharp gradients in the potential in the lateral direction perpendicular to the radial channels 90 along the apertures sidewalls.

Figure 6:
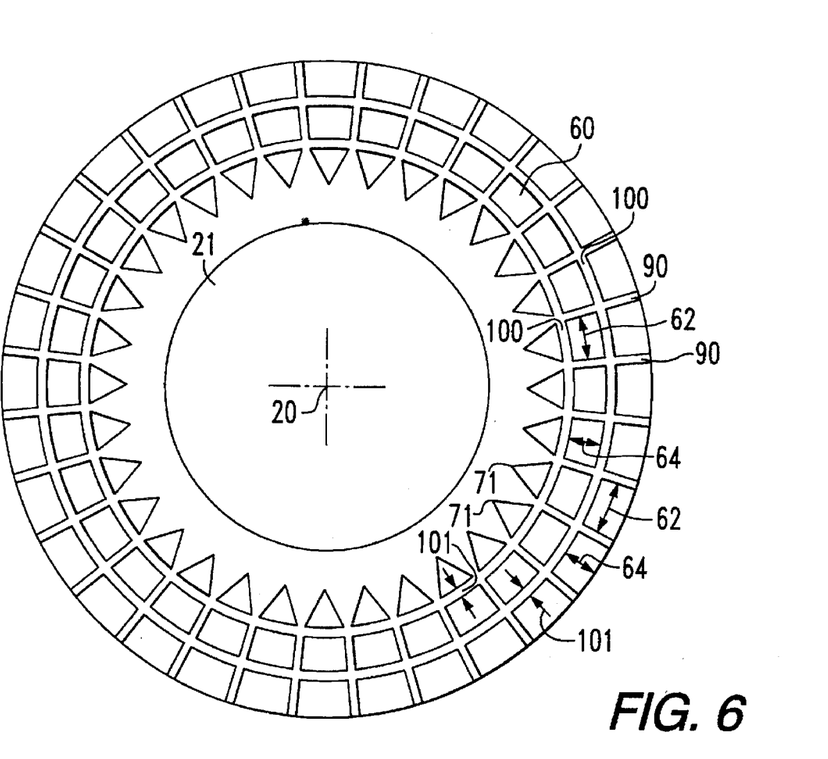
FIG. 6 shows a modification of the embodiment of the invention of FIG. 5 to include circumferential channels connecting the radially directed current flow channels.

To obviate this circumstance, the SIPOS current flow regions are allowed to include circumferential (or transverse) channel components, shown at 100 in FIG. 6, connecting the radially directed channels 90. The effect of each transverse channel 100 is to reduce the radial dimension of each aperture 60, so that the amount that the field lines are allowed to stray is also reduced.

The additional channels 100 provide a boundary condition that the electric potential is nearly exactly constant along these channels, even at the locations where the transverse channels 100 intersect the radial channels 90. This reduces the fringing contribution to |E| to an acceptable level.

In order to prevent too much of the voltage drop from occurring in the apertures 60, the transverse channels 100 must be dimensioned so that the total radial widths 101 of these channels is small compared with the radial dimensions 64 of the apertures 60. As long as the radial dimensions 101 of the transverse channels 100 are less than the radial dimensions 64 of the apertures 60 by a factor of three, then the quantity of field lines concentrated in the apertures is relatively limited (only a 25% increase). This constraint does not limit the number of non-radial channels so that this ratio is not exceeded. The ultimate pattern configuration of the SIPOS layer depends upon how finely (to what spatial resolution) the SIPOS layer can be patterned. The finer the pattern, the better the improvement, since this allows for more channels and smaller apertures with the same control over average resistivity.

As a non-limiting example of making channels 90 four microns wide, in order to make the average resistivity in the outer portion 83 of the SIPOS layer 15 six times that of the value of resistivity at the interior, the non-radial (transverse) widths 62 of the apertures 60 must be twenty microns wide. For a device where the interior radius of the SIPOS layer (at the edge of drain contact region 21) is sixty microns, and the outer radius of the SIPOS layer (at the inner edge of source region 23) is one hundred twenty microns, these limitations allow for thirty-two radial channels 90.

Figure 9:
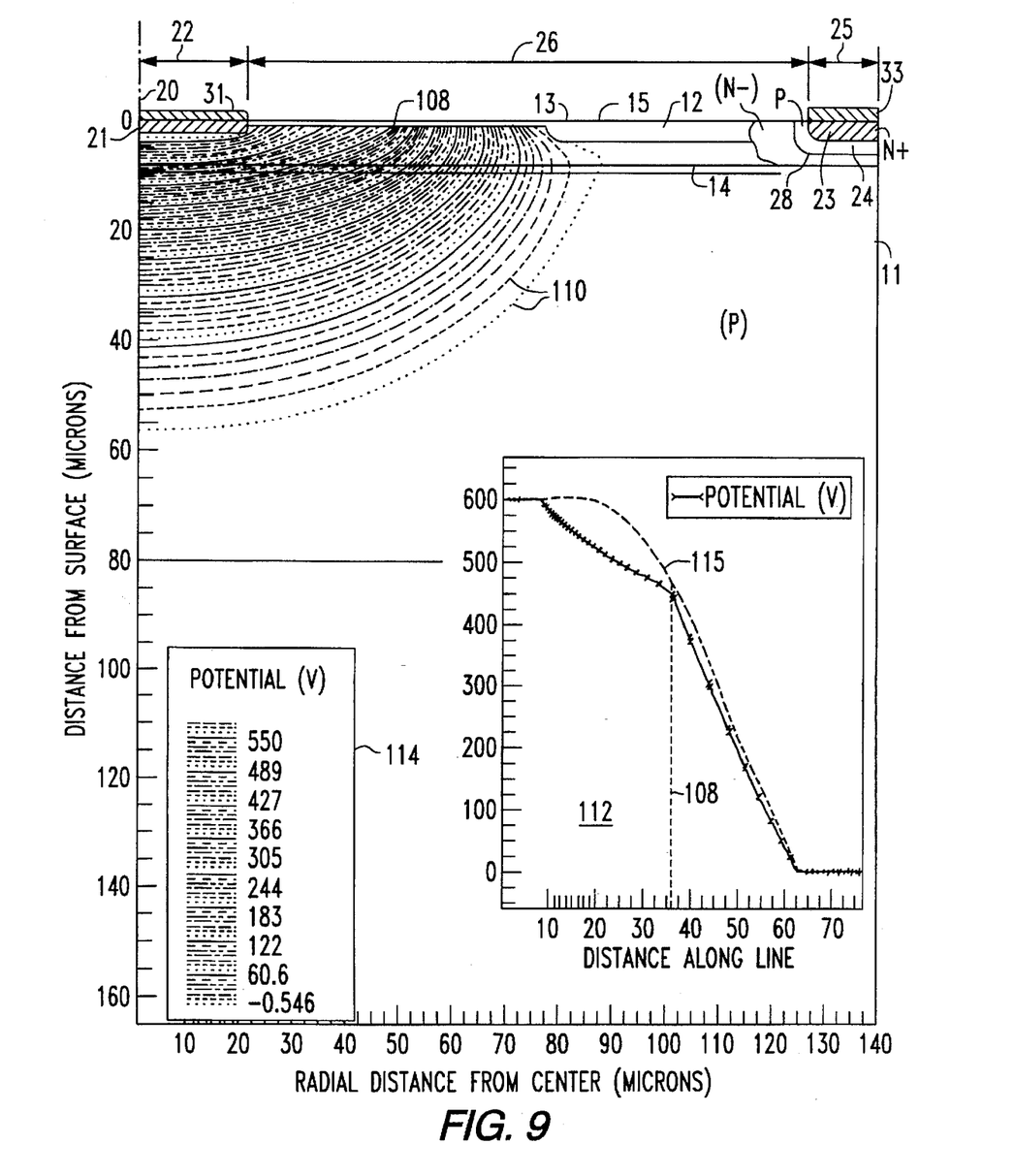
FIG. 9 diagrammatically illustrates a cross-sectional slice of a cylindrically symmetrical DMOS device, of the type shown in FIGS. 1 and 2, and having its SIPOS layer patterned similar to that of FIG. 5.

FIG. 9 diagrammatically illustrates a cross-sectional slice of a cylindrically symmetrical DMOS device, of the type shown in FIGS. 1, 1A and 2, described above, but having its SIPOS layer 15 patterned in rough accordance with the aperture pattern of FIG. 6. As in the above embodiment, FIG. 9 shows equipotential contour lines 110, associated with the application of a reverse bias of 600 volts between the N+ drain contact region 21 and underlying P-type substrate 11.

An inlaid plot of the potential across the SIPOS layer is shown at 112, while the associated contour values for the main plot are shown at superimposed voltage plot 114. In FIG. 9, the density of these contour lines 110 reveals that the maximum electric field, rather than occurring near the corner of the PN junction, is located at a point 108 that is radially displaced outwardly towards the source region 23. It should be observed that the slope of the associated voltage variation depicted in plot 114 is decreased in the vicinity of the N+ drain contact region, so that the voltage variation tends to become more like the ideal characteristic (from FIG. 3) shown at 115.

It should also be noted that the diagrammatic illustration of FIG. 9 has only two regions of SIPOS resistivity. However, the patterns shown in FIGS. 5 and 6 taper the SIPOS resistivity more gradually and do not have as pronounced a peak 108 as shown in FIG. 9.

Rather than modify the physical composition of the SIPOS layer, by patterning the layer with a plurality of apertures that are distributed in that region of the SIPOS material where the radial resistance begins to decrease substantially (with increasing radial separation from the drain region in the present example), modification of the physical composition of the SIPOS layer may be accomplished by selectively doping the SIPOS with a resistivity-altering impurity.

For a cylindrically configured DMOS structure, such as that described above, a prescribed conductivity type impurity (e.g. conventional dopants, such as boron, arsenic, antimony and phosphorus) may be introduced into a plurality of surface portions of the SIPOS layer 15 in the vicinity of the drain region (as opposed to forming apertures in the vicinity of the source region as in the first embodiment).

The masking pattern used to dope the impurity may contain a plurality of dopant introduction-apertures similar to the SIPOS. The effect of the selective impurity introduction is to increase the effective conductivity of the SIPOS in the vicinity of the drain region and thereby reduce the voltage drop across that portion of the SIPOS layer containing the dopant. While the net effect on spreading out the resistivity of the SIPOS due to the dopant introduction methodology of this second embodiment is essentially the same as that of patterning the SIPOS layer as in the first embodiment, because the doping reduces the resistivity of the SIPOS layer, it increases leakage current through the SIPOS layer.

Figure 10:
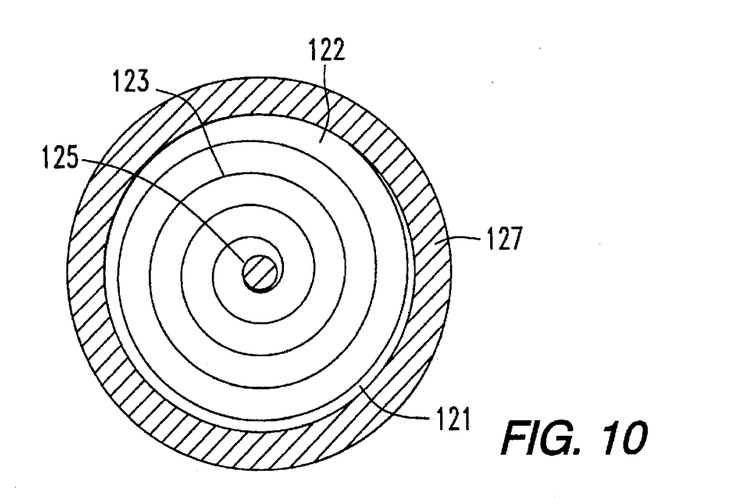
FIG. 10 diagrammatically illustrates a further embodiment of the present invention having a spiral aperture in a SIPOS layer.

FIG. 10 diagrammatically illustrates a top view of further embodiment of the present invention in which the desired variation in the composition (increase in resistance) of a SIPOS layer 121 is achieved by forming one or more grooves or channels 123, which extend in a spiral path through the SIPOS layer 121 between a centrally located drain region 125 and an annular source region 127, that surrounds the drain region. In effect, the spiral channel 123 confines the effective current flow path through the SIPOS layer 121 to a spiral track 122 that occupies the SIPOS layer 121 from and around the center drain region 125 out to the surrounding source region 127. Such a spiral groove can increase the effective resistivity of the SIPOS layer by more than two orders of magnitude.

As will be appreciated from the foregoing description, the voltage breakdown problem that results from the non-linearity of the electric field beneath a high resistivity layer, such as a SIPOS layer or layer of undoped polysilicon, is effectively remedied by modifying the physical composition of the high resistivity layer in such a manner that the electric field in the underlying substrate is made more uniform across the surface of the device. For the case of a cylindrically symmetrical (DMOS) device, described above, making the field more uniform in the radial direction effectively spreads out or reduces the field away from its normal peak region near the corner of the underlying (drain/substrate) PN junction, thereby increasing the voltage breakdown of that PN junction. Further, since the overall effective resistivity is increased, the leakage current through the SIPOS is decreased.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A semiconductor device comprising a semiconductor layer having a first surface adjacent to which a PN junction is formed, and a layer of high resistance material overlying said first surface of said semiconductor layer between first and second locations thereof, and wherein the physical composition of said layer of high resistance material varies between said first and second locations of said semiconductor layer, and wherein said layer of high resistance material has a plurality of apertures patterned therein between said first and second locations of said semiconductor layer.

2. A semiconductor device according to claim 1, wherein said plurality of apertures are patterned in accordance with a non-linear distribution of apertures in said layer of high resistance material between said first and second locations of said semiconductor layer.

3. A semiconductor device according to claim 1, wherein said apertures are generally wedge shaped, and wherein pointed ends of said generally wedge shaped apertures are pointed toward said first location of said semiconductor layer, so that said apertures diverge from said pointed ends along first sidewalls and then taper in the radial direction along second additional sidewalls, forming channels between said second additional sidewalls of said apertures.

4. A semiconductor device according to claim 3, wherein said generally wedge shaped apertures have a divergence angle from said points along said first sidewalls in a range on the order of 45°–65°.

5. A semiconductor device according to claim 4, wherein the distance between said second additional sidewalls of each aperture is angled such that the width of each channel through which current flows is constant.

6. A semiconductor device according to claim 3, wherein said channels are interconnected by transverse channel portions, to reduce the radial dimension of each aperture, so as to provide a boundary condition that the electric potential is nearly constant along the channels, so as to reduce a fringing contribution to the electric field.

7. A semiconductor device according to claim 1, wherein said semiconductor layer has a first conductivity type and includes a first semiconductor region of a second conductivity type extending to said second location and forming a PN junction with said semiconductor layer.

8. A semiconductor device comprising a semiconductor layer having a first surface adjacent to which a PN junction is formed, and a layer of high resistance material overlying said first surface of said semiconductor layer between first and second locations thereof, and wherein the physical composition of said layer of high resistance material varies between said first and second locations of said semiconductor layer, and wherein said semiconductor layer has a first conductivity type and is disposed atop an underlying semiconductor substrate of a second conductivity type and thereby forms a PN junction with said semiconductor layer, said PN junction extending between said first and second locations of said semiconductor layer.

9. A semiconductor device according to claim 8, wherein said semiconductor layer includes a first semiconductor region of said second conductivity type extending to said second location and forming a further PN junction with said semiconductor layer, spaced apart from said PN junction.

10. A semiconductor device according to claim 9, wherein said semiconductor layer further includes a second semiconductor region of said first conductivity type and having an impurity concentration greater than that of said semiconductor layer formed in said first location of said semiconductor layer.

11. A semiconductor device according to claim 10, wherein said semiconductor layer further includes a third semiconductor region of said first conductivity type formed in said first semiconductor region.

12. A semiconductor device according to claim 11, wherein said layer of high resistance material is coupled in ohmic contact with said second and third semiconductor regions.

13. A semiconductor device according to claim 8, wherein a first voltage is coupled to said semiconductor layer and a second voltage is coupled to said underlying semiconductor substrate, so as to reverse bias said PN junction.

14. A semiconductor device according to claim 11, wherein each of said first and second semiconductor regions has a non-linear configuration.

15. A semiconductor device according to claim 14, wherein said first semiconductor region has a first curved portion, and said second semiconductor region second electrode has a second curved portion and is spaced apart from said first semiconductor region.

16. A semiconductor device according to claim 14, wherein said second semiconductor region has a generally circular configuration, and said first semiconductor region has a generally annular configuration surrounding and radially spaced apart from said second semiconductor region.

17. A semiconductor device having a semiconductor substrate of a first conductivity type, a semiconductor layer of a second conductivity type overlying said semiconductor substrate and forming a first PN junction with said semiconductor substrate, a first semiconductor region of said first conductivity type extending to a first location of and forming a second PN junction with said semiconductor layer, a first electrode, to which a first voltage is applied, coupled to a second location of said semiconductor layer, a second electrode, to which a second voltage is applied, so as to reverse bias said first PN junction, coupled to said substrate, and a layer of high resistance material overlying said first surface of said semiconductor layer between first and second locations thereof, and being operative to distribute an electric field thereacross into said semiconductor layer, and wherein the physical composition of said layer of high resistance material varies between said first and second locations of said semiconductor layer in such a manner that said electric field is effectively spread out away from its normal peak region in the vicinity of said first electrode, thereby increasing the voltage breakdown of said PN junction therebeneath.

18. A semiconductor device according to claim 17, wherein said layer of said high resistance material comprises a layer of semi-insulating polysilicon.

19. A semiconductor device according to claim 17, wherein said layer of semi-insulating material has a variable impurity distribution between said first and second locations of said semiconductor layer.

20. A semiconductor device according to claim 17, wherein each of said first and second electrodes has a non-linear configuration.

21. A semiconductor device according to claim 20, wherein said first electrode has a first curved portion, and said second electrode has a second curved portion and is spaced apart from said first electrode.

22. A semiconductor device according to claim 20, wherein said first electrode has a generally circular configuration, and said second electrode has a generally annular configuration surrounding and radially spaced apart from said first electrode.

23. A semiconductor device according to claim 17, wherein said layer of high resistance material has a plurality of apertures patterned therein between said first and second locations of said semiconductor substrate, said plurality of apertures being patterned in accordance with a non-linear distribution of apertures in said layer of high resistance material between said first and second locations of said semiconductor substrate, said apertures being located radially distant from said first electrode where the electric field concentration is highest, and being shaped so as to concentrate the current density along prescribed geometric current flow regions through said layer of semi-insulating material layer at such radially distant locations, so that said apertures effectively reduce the surface area of said layer of high resistance material through which current can flow, and thereby increase the effective resistivity of said layer of high resistance material at said radially distant current flow regions.

24. A semiconductor device according to claim 23, wherein said apertures are generally wedge shaped, and wherein pointed ends of said generally wedge shaped apertures are pointed toward said second location of said substrate, so that said apertures diverge from said pointed ends along first sidewalls and then taper in the radial direction along second additional sidewalls, forming channels between said second additional sidewalls of said apertures.

25. A semiconductor device according to claim 24, wherein said generally wedge shaped apertures have a divergence angle from said points along said first sidewalls in a range on the order of 45°–65°.

26. A semiconductor device according to claim 25, wherein the distance between said second additional sidewalls of each aperture is angled such that the width of each channel through which current flows is constant.

27. A semiconductor device according to claim 24, wherein said channels are interconnected by transverse channel portions, to reduce the radial dimension of each aperture, so as to provide a boundary condition that the electric potential is nearly constant along the channels, so as to reduce a fringing contribution to the electric field.

28. A semiconductor device having a semiconductor substrate of a first conductivity type, a first semiconductor region of said first conductivity type and having an impurity greater than that of said substrate and extending to a first location of said substrate, a second semiconductor region of a second conductivity type extending to a second location of said semiconductor substrate spaced apart from said first location thereof, and forming a first PN junction with said semiconductor substrate, and a layer of high resistance material overlying said first surface of said semiconductor substrate between first and second locations thereof, and being operative to distribute an electric field thereacross into said substrate, and wherein the effective resistivity of said layer of high resistance material is different farther away from said first location of said semiconductor substrate than it is closer to said first location of said semiconductor substrate.

29. A semiconductor device according to claim 28, wherein said layer of high resistance material contains a plurality of conductivity modification regions which cause the effective resistivity of said layer of high resistance material to be different farther away from said first location of said semiconductor substrate than it is closer to said first location of said semiconductor substrate.

30. A semiconductor device according to claim 29, wherein said plurality of conductivity modification regions comprise discontinuities in the current flow path through said layer of high resistivity material.

31. A semiconductor device according to claim 29, wherein said discontinuities comprise apertures through said layer of high resistivity material.

32. A semiconductor device according to claim 31, wherein said apertures are generally wedge shaped, and wherein pointed ends of said generally wedge shaped apertures are pointed toward said first location of said substrate, so that said apertures diverge from said pointed ends along first sidewalls and then angle in a primarily radial direction along second additional sidewalls, forming channels between said second additional sidewalls of said apertures.

33. A semiconductor device according to claim 32, wherein said generally wedge shaped apertures have a divergence angle from said points along said first sidewalls in a range on the order of 45°–65°.

34. A semiconductor device according to claim 33, wherein the distance between said second additional sidewalls of each aperture is angled such that the width of each channel through which current flows is constant.

35. A semiconductor device according to claim 34, wherein said channels are interconnected by transverse channel portions, to reduce the radial dimension of each aperture, so as to provide a boundary condition that the electric potential is nearly constant along the channels, so as to reduce a fringing contribution to the electric field.

36. A semiconductor device according to claim 28, wherein said layer of high resistance material has a variable impurity distribution between said first and second locations of said semiconductor substrate.

37. A semiconductor device according to claim 28, wherein each of said first and second semiconductor regions has a non-linear configuration.

38. A semiconductor device according to claim 37, wherein said first semiconductor region has a first curved portion, and said second semiconductor region has a second curved portion and is spaced apart from said first semiconductor region.

39. A semiconductor device according to claim 37, wherein said first semiconductor region has a generally circular configuration, and said second semiconductor region has a generally annular configuration surrounding and radially spaced apart from said first semiconductor region.

40. A method of applying an electric field to a semiconductor device, said semiconductor device having a semiconductor layer with a first surface adjacent to which a PN junction is formed, comprising the steps of:
(a) forming a layer of high resistance material overlying said first surface of said semiconductor layer, by forming said layer of high resistance material such that said layer of high resistance material has a plurality of apertures patterned therein between said first and second locations of said semiconductor layer; and
(b) applying a differential voltage to said layer of high resistance material between said first and second locations of said semiconductor layer.

41. A method according to claim 40, wherein step (a) comprises patterning a non-linear distribution of apertures in said layer of high resistance material between said first and second locations of said semiconductor layer.

42. A method according to claim 40, wherein step (a) comprises forming said apertures to be generally wedge shaped, and wherein pointed ends of said generally wedge shaped apertures are pointed toward said first location of said semiconductor layer, so that said apertures diverge from said pointed ends along first sidewalls and then taper in the radial direction along second additional sidewalls, forming channels between said second additional sidewalls of said apertures.

43. A method according to claim 42, wherein said generally wedge shaped apertures have a divergence angle from said points along said first sidewalls in a range on the order of 45°–65°.

44. A method according to claim 43, wherein the distance between said second additional sidewalls of each aperture is angled such that the width of each channel through which current flows as a result of the application of said differential voltage in step (b) is constant.

45. A method according to claim 42, wherein step (a) comprises patterning said layer of high resistance material such that said channels are interconnected by transverse channel portions, to reduce the radial dimension of each aperture, so as to provide a boundary condition that the electric potential is nearly constant along the channels, so as to reduce a fringing contribution to the electric field.

46. A method of applying an electric field to a semiconductor device, said semiconductor device having a semiconductor layer with a first surface adjacent to which a PN junction is formed, comprising the steps of:
(a) forming a layer of high resistance material overlying said first surface of said semiconductor layer between first and second locations thereof, such that the physical composition of said layer of high resistance material varies between said first and second locations of said semiconductor layer; and
(b) applying a differential voltage to said layer of high resistance material between said first and second locations of said semiconductor layer,
wherein said semiconductor layer has a first conductivity type and includes a first semiconductor region of a second conductivity type extending to said second location and forming a further PN junction with said semiconductor layer.

47. A method of applying an electric field to a semiconductor device, said semiconductor device having a semiconductor layer with a first surface adjacent to which a PN junction is formed, comprising the steps of:
(a) forming a layer of high resistance material overlying said first surface of said semiconductor layer between first and second locations thereof, such that the physical composition of said layer of high resistance material varies between said first and second locations of said semiconductor layer; and
(b) applying a differential voltage to said layer of high resistance material between said first and second locations of said semiconductor layer,
wherein said semiconductor layer has a first conductivity type and is disposed atop an underlying semiconductor substrate of a second conductivity type and thereby forms a first PN junction with said semiconductor layer, said first PN junction extending between said first and second locations of said semiconductor layer.

48. A method according to claim 47, wherein said semiconductor layer includes a first semiconductor region of said second conductivity type extending to said second location and forming an additional PN junction with said semiconductor layer, spaced apart from said first PN junction.

49. A method according to claim 48, wherein said semiconductor layer further includes a second semiconductor region of said first conductivity type and having an impurity concentration greater than that of said semiconductor layer formed in said first location of said semiconductor layer.

50. A method according to claim 49, wherein said semiconductor layer further includes a third semiconductor region of said first conductivity type formed in said first semiconductor region.

51. A method according to claim 50, wherein step (a) comprises forming said layer of high resistance material in ohmic contact with said second and third semiconductor regions.

52. A method according to claim 47, wherein said first PN junction is reverse-biased.

53. A method according to claim 50, wherein each of said first and second semiconductor regions has a non-linear configuration.

54. A semiconductor device comprising a semiconductor layer having a first surface adjacent to which a PN junction is formed, and a layer of high resistance material overlying said first surface of said semiconductor layer between first and second locations thereof, and wherein the physical composition of said layer of high resistance material and thereby average resistivity thereof varies in a direction through said layer of high resistance material corresponding to a direction of current flow through said semiconductor layer between said first and second locations of said semiconductor layer, so as to spread out the electric field in said semiconductor layer underlying said layer of high resistance material in said direction of current flow through said semiconductor layer and thereby increase the voltage breakdown of said PN junction.

55. A semiconductor device according to claim 54, wherein said layer of high resistance material comprises a layer of semi-insulating polysilicon.

56. A semiconductor device according to claim 55, wherein said layer of high resistance material has a varying impurity distribution therethrough along said direction of said current flow path between said first and second locations of said semiconductor layer.

57. A semiconductor device according to claim 54, wherein said layer of high resistance material has a plurality of apertures patterned therein between said first and second locations of said semiconductor layer.

58. A semiconductor device according to claim 57, wherein said plurality of apertures are patterned to control dimensions of channels therebetween in said layer of high resistance material between said first and second locations of said semiconductor layer.

59. A semiconductor device according to claim 54, wherein said semiconductor layer has a first conductivity type and includes a first semiconductor region of a second conductivity type extending to said second location and forming a PN junction with said semiconductor layer.

60. A method of applying an electric field to a semiconductor device, said semiconductor device having a semiconductor layer with a first surface adjacent to which a PN junction is formed, comprising the steps of:

(a) forming a layer of high resistance material overlying said first surface of said semiconductor layer between first and second locations thereof, such that the physical composition of said layer of high resistance material varies between said first and second locations of said semiconductor layer, and average resistivity thereof resulting from the application of a differential voltage to said layer of high resistance material between said first and second locations of said semiconductor layer, varies in a direction through said layer of high resistance material corresponding to a direction of current flow through said semiconductor layer between said first and second locations of said semiconductor layer, so as to spread out the electric field in said semiconductor layer underlying said layer of high resistance material in said direction of current flow through said semiconductor layer and increase the voltage breakdown of said PN junction; and (b) applying said differential voltage to said layer of high resistance material between said first and second locations of said semiconductor layer.

61. A method according to claim 60, wherein said layer of high resistance material comprises a layer of semi-insulating polysilicon.

62. A method according to claim 60, wherein said layer of high resistance material has a variable impurity distribution between said first and second locations of said semiconductor layer.

63. A method according to claim 60, wherein step (a) comprises forming said layer of high resistance material such that said layer of high resistance material has a plurality of apertures patterned therein between said first and second locations of said semiconductor layer.

64. A method according to claim 63, wherein step (a) comprises patterning a distribution of apertures in said layer of high resistance material between said first and second locations of said semiconductor layer to thereby control dimensions of channels between said apertures.

* * * * *